(12) United States Patent
Lee et al.

(10) Patent No.: US 10,777,659 B2
(45) Date of Patent: Sep. 15, 2020

(54) SELF-ALIGNED BOTTOM SOURCE/DRAIN EPITAXIAL GROWTH IN VERTICAL FIELD EFFECT TRANSISTORS

(71) Applicant: International Business Machines Corporation, Armonk, NY (US)

(72) Inventors: Choonghyun Lee, Rensselaer, NY (US); Ruqiang Bao, Niskayuna, NY (US); Shogo Mochizuki, Clifton Park, NY (US); Brent A. Anderson, Jericho, VT (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/191,549

(22) Filed: Nov. 15, 2018

(65) Prior Publication Data
US 2020/0161451 A1    May 21, 2020

(51) Int. Cl.
| | |
|---|---|
| *H01L 29/66* | (2006.01) |
| *H01L 29/06* | (2006.01) |
| *H01L 29/08* | (2006.01) |
| *H01L 29/786* | (2006.01) |
| *H01L 21/8238* | (2006.01) |
| *H01L 27/092* | (2006.01) |
| *H01L 29/04* | (2006.01) |
| *H01L 29/423* | (2006.01) |

(Continued)

(52) U.S. Cl.
CPC .......... *H01L 29/66666* (2013.01); *H01L 21/823821* (2013.01); *H01L 27/0924* (2013.01); *H01L 29/045* (2013.01); *H01L 29/0653* (2013.01); *H01L 29/0847* (2013.01); *H01L 29/1608* (2013.01); *H01L 29/42392* (2013.01); *H01L 29/4966* (2013.01); *H01L 29/66439* (2013.01); *H01L 29/78642* (2013.01)

(58) Field of Classification Search
None
See application file for complete search history.

(56) References Cited

U.S. PATENT DOCUMENTS

| | | | |
|---|---|---|---|
| 9,299,835 B1 | 3/2016 | Anderson et al. | |
| 9,472,647 B2 | 10/2016 | Xiao et al. | |
| 9,640,636 B1 | 5/2017 | Bentley et al. | |

(Continued)

*Primary Examiner* — Shaun M Campbell
*Assistant Examiner* — Aneta B Cieslewicz
(74) *Attorney, Agent, or Firm* — Fleit Intellectual Property Law; Thomas S. Grzesik

(57) ABSTRACT

A semiconductor device and a method for fabricating the same. The semiconductor device includes at least a n-type vertical FET and a p-type vertical FET. The n-type vertical FET includes at least a first bottom source/drain layer. The p-type vertical FET includes at least a second bottom source/drain layer. A silicon dioxide layer separates the first bottom source/drain layer and the second bottom source/drain layer. The method includes forming a first bottom source/drain layer in a p-type vertical FET device area. A germanium dioxide layer is formed in contact with the first semiconductor layer a second semiconductor fin formed within a n-type vertical FET device area. A silicon dioxide layer is formed in contact with the first bottom source/drain layer from the germanium dioxide layer. A second bottom source/drain layer is formed in contact with the second semiconductor fin and the silicon dioxide layer.

7 Claims, 11 Drawing Sheets

(51) Int. Cl.
*H01L 29/49* (2006.01)
*H01L 29/16* (2006.01)

(56) References Cited

U.S. PATENT DOCUMENTS

| | | |
|---|---|---|
| 9,947,675 B1 | 4/2018 | Balakrishnan et al. |
| 9,985,115 B2 | 5/2018 | Anderson et al. |
| 10,043,715 B2 | 8/2018 | Anderson et al. |
| 2015/0372149 A1 | 12/2015 | Colinge et al. |
| 2017/0358497 A1 | 12/2017 | Cheng et al. |
| 2017/0373063 A1* | 12/2017 | Bao .................... H01L 27/0924 |
| 2018/0005904 A1 | 1/2018 | Lee et al. |
| 2018/0090494 A1 | 3/2018 | Chao et al. |
| 2019/0214484 A1* | 7/2019 | Niimi .................. H01L 29/7788 |

* cited by examiner

SELF-ALIGNED BOTTOM SOURCE/DRAIN EPITAXIAL GROWTH IN VERTICAL FIELD EFFECT TRANSISTORS

BACKGROUND OF THE INVENTION

The present disclosure generally relates to the field of semiconductors, and more particularly relates to vertical field effect transistors.

Vertical field effect transistors (VFETs) are becoming viable device options for semiconductor devices, for example, complementary metal oxide semiconductor (CMOS) devices, beyond 5 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method for forming a semiconductor device is disclosed. The method comprises at least the following operations. A first bottom source/drain layer is formed in contact with at least a first semiconductor fin formed within a p-type vertical field effect transistor (FET) device area. A germanium dioxide layer is formed in contact with the first semiconductor fin and a second semiconductor fin formed within a n-type vertical FET device area. A silicon dioxide layer is formed in contact with the first bottom source/drain layer from the germanium dioxide layer. Remaining portions of the germanium dioxide layer are removed. A second bottom source/drain layer is formed in contact with the second semiconductor fin and the silicon dioxide layer.

In another embodiment, a semiconductor device is disclosed. The semiconductor device comprises a n-type vertical field effect transistor and a p-type vertical field effect transistor. The n-type vertical field effect transistor comprises at least a first bottom source/drain layer, and the p-type vertical field effect transistor comprises at least a second bottom source/drain layer. A silicon dioxide layer separates and contacts the first bottom source/drain layer and the second bottom source/drain layer.

In a further embodiment, an integrated circuit is disclosed. The integrated circuit comprises at least one semiconductor device. The semiconductor device comprises a n-type vertical field effect transistor and a p-type vertical field effect transistor. The n-type vertical field effect transistor comprises at least a first bottom source/drain layer, and the p-type vertical field effect transistor comprises at least a second bottom source/drain layer. A silicon dioxide layer separates and contacts the first bottom source/drain layer and the second bottom source/drain layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
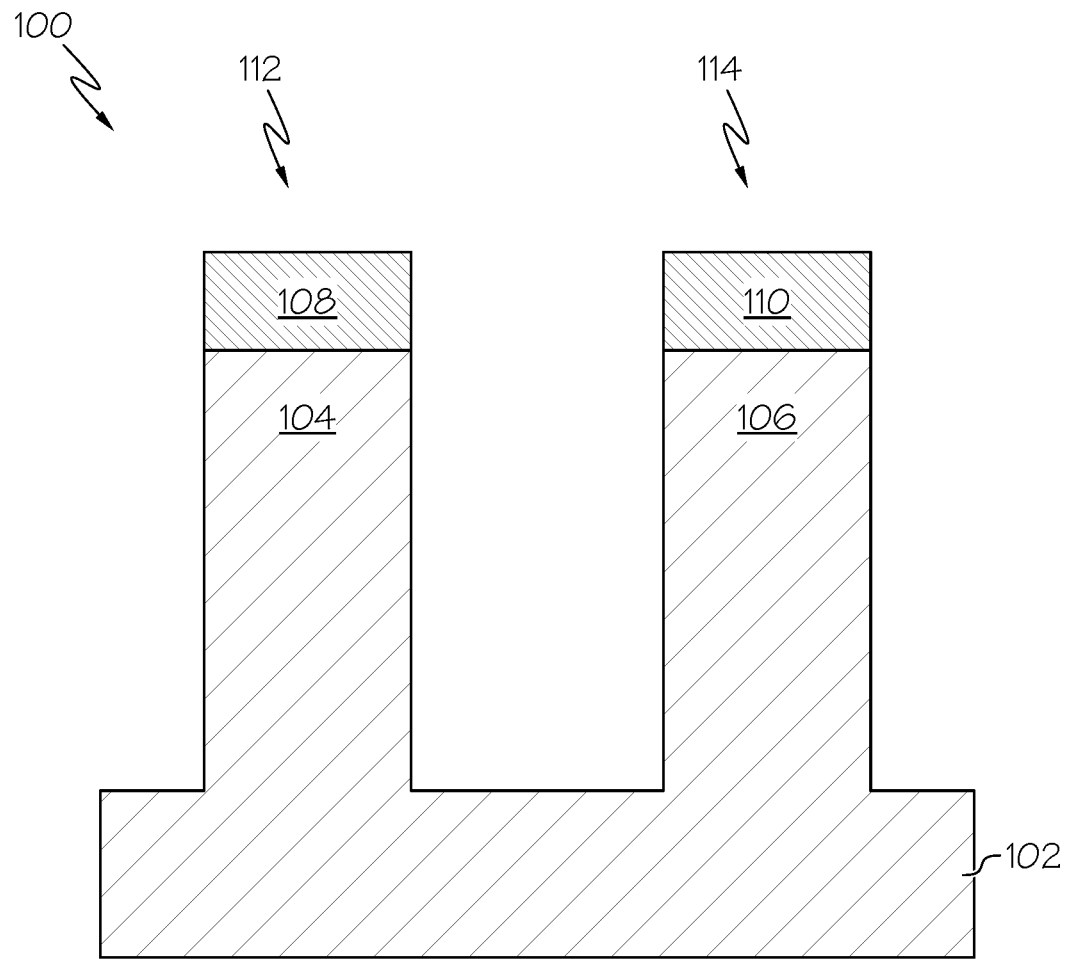
FIG. 1 is a cross-sectional view of a semiconductor structure after a plurality of fin structures have been formed on a substrate according one embodiment of the present invention.

Vertical transistors may provide higher density scaling and allow for relaxed gate lengths to better control device electrostatics, without sacrificing the gate contact pitch size. However, with ever decreasing device dimensions, forming the individual components and electrical contacts become more difficult.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

As density scaling of semiconductor components increases problems may arise during fabrication of semiconductor devices. For example, CMOS device comprise complementary nFETs and pFETs. When fabricating a CMOS device utilizing vertical nFETs and vertical pFETs the tight pitch between these transistors may be problematic when forming their epitaxy bottom source/drain layers. In particular, the tight pitch makes aligning the nFET bottom source/drain and pFET bottom source/drain difficult without overlapping these layers onto the pFET and nFET device areas, respectively. Embodiments of the present invention overcome these problems by utilizing self-aligned bottom source/drain epitaxial growth with a single mask that minimizes patterning variations caused by conventional techniques.

Referring now to the drawings in which like numerals represent the same or similar elements, FIG. 1 shows a semiconductor structure 100 at a given point in the fabrication process. For example, FIG. 1 shows a substrate 102; a plurality of semiconductor fin structures 104, 106; and a hard mask 108, 110 formed on and in contact with a top surface of each fin structure 104, 106. In some embodiments, the substrate 102 is a bulk substrate. In the example shown in FIG. 1, each fin 104, 106 defines the channel region of an nFET device 112 and a pFET device 114, respectively. In one embodiment, the substrate 102 is comprised entirely of a semiconductor material. The substrate 102 may comprise a single crystalline semiconductor material or a polycrystalline material. In another embodiment, the substrate 102 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

The substrate 102 may comprise undoped or doped single crystalline silicon. Examples of materials fir the substrate 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multi-gate devices can be formed. In other embodiments, the substrate 102 is formed on and in contact with a handle substrate or an insulating layer disposed in contact with a handle substrate. In this embodiment, the handle substrate includes similar materials to those discussed above.

In other embodiments, the substrate 102 is a silicon-on-insulator (SOI) substrate. In this example, an optional dielectric layer (e.g., a BOX layer or oxide layer) overlies the substrate, and the fin structures 104, 106 are formed on and in contact with the dielectric layer. The optional dielectric layer may be formed from any of several dielectric materials. Non-limiting examples include, for example, oxides, nitrides and oxynitrides of silicon. The dielectric layer may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick. In an embodiment where the fins structures are formed on an SOI substrate, the fin structures and the substrate can be made of the same or different materials.

In an SOI embodiment, the semiconductor material/layer from which the fin structures 104, 106 are fabricated may be formed utilizing various methods such as a layer transfer process including a bonding step, or an implantation process such as SIMOX (Separation by IMplantation of OXygen). This semiconductor material/layer nay be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from $1\times10^{18}$ atoms/cm$^3$ to $2\times10^{21}$ atoms/cm$^3$. N-type transistors are produced by doping the semiconductor material/layer with elements from group V of the periodic table (e.g., phosphorus, antimony, or arsenic).

The fin structures 104, 106 may be formed by forming an etch-stop hard mask onto the substrate 102 (or semiconductor layer) through, for example, deposition. The etch-stop hard mask may be made of, for example, silicon oxide, silicon oxynitride, silicon carbide, silicon oxycarbide, silicon nitride, titanium nitride, tetraethyl orthosilicate a combination thereof, and/or other materials suitable in providing etch-stop function. The fin structures 104, 106 are subsequently formed or etched out of the substrate 102 (or the semiconductor layer) through a process involving masking, using industry-standard lithographic techniques, and directionally etching (e.g., RIE) the etch-stop capping layer and underneath semiconductor layer (or substrate 102). After the RIE etching process, the photo-resist mask used in the lithographic etching process may be removed, leaving the fin structures 104, 106 and hard masks 108, 110. In some embodiments, there may be different pitches between two or more of the fin structures to define different devices.

Figure 2:
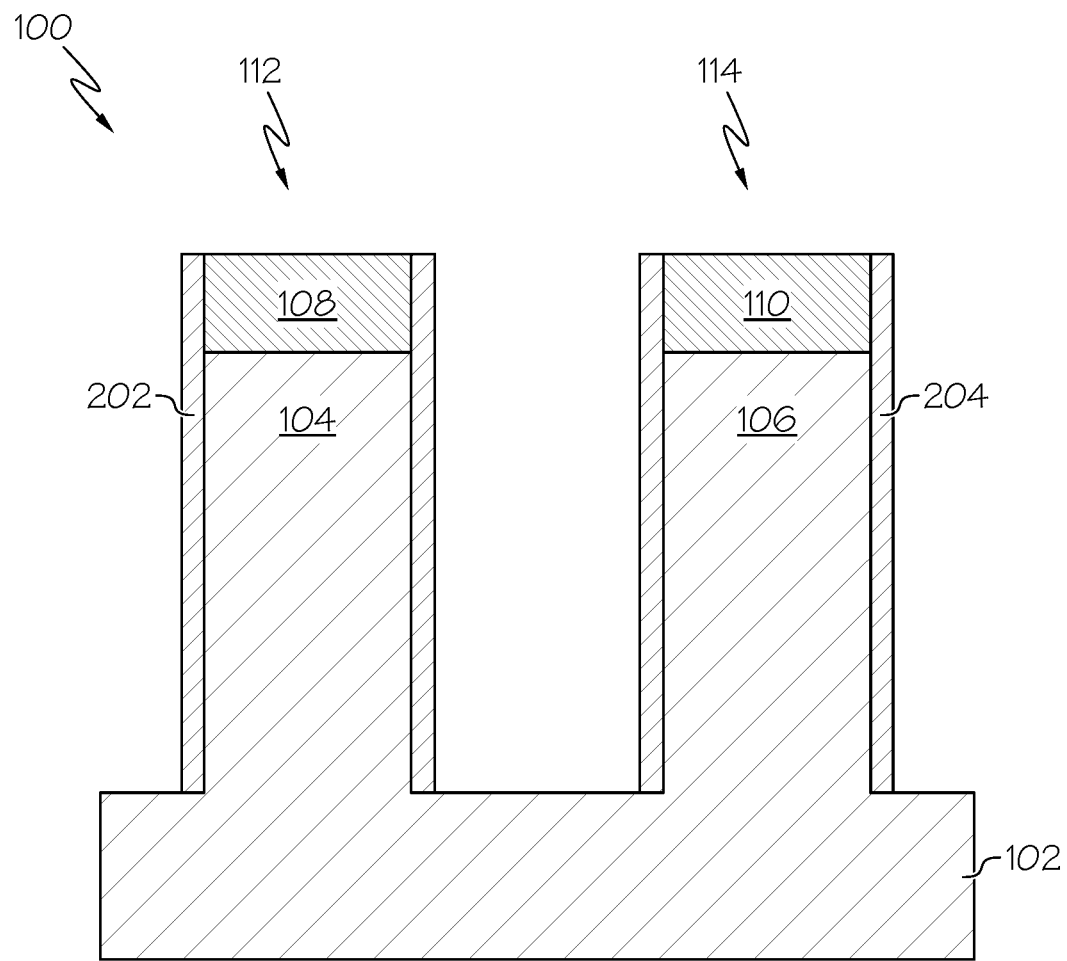
FIG. 2 is a cross-sectional view of the semiconductor structure after fin sidewall liners have been formed according one embodiment of the present invention.

Fin sidewall liners 202, 204 are then formed on the sidewalls of the fin structures 104, 106 as shown in FIG. 2. In one embodiment, the sidewall liners 202, 204 are formed by depositing a material such as silicon nitride over the entire structure. The material may be deposited using a process such as chemical vapor deposition (CVD), plasma-enhanced chemical vapor deposition (PECVD), atomic layer deposition (ALD), and/or the like. One or more etching processes such as a spacer RIE (reactive ion etch) are then performed to remove the sidewall liner material from horizontal surfaces of the structure thereby leaving the material only on the vertical sidewalls of the fins 104, 106 and hardmasks 108, 110. In one embodiment, the sidewall liners 202, 204 may extend down to and contact the top surface of the substrate 102.

Figure 3:
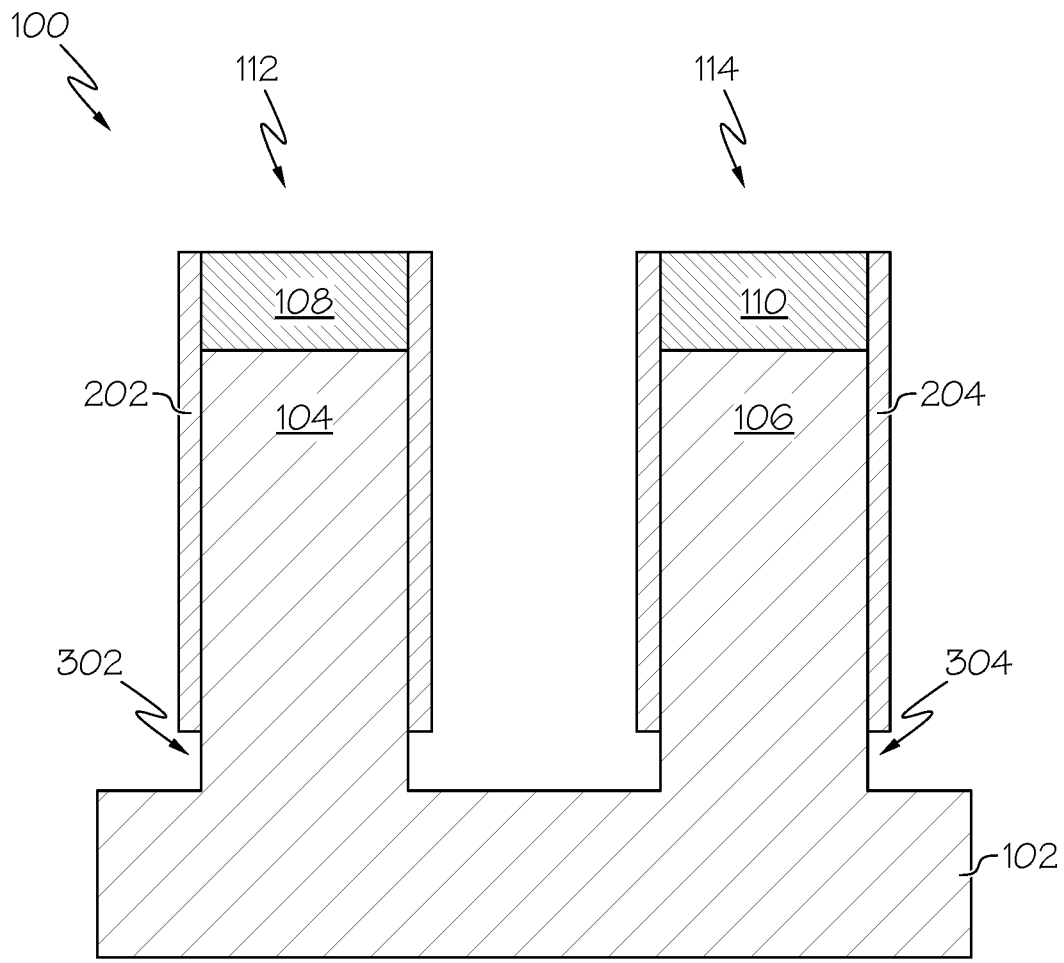
FIG. 3 is a cross-sectional view of the semiconductor structure after a bottom portion of the fins have been recessed according one embodiment of the present invention.
Figure 4:
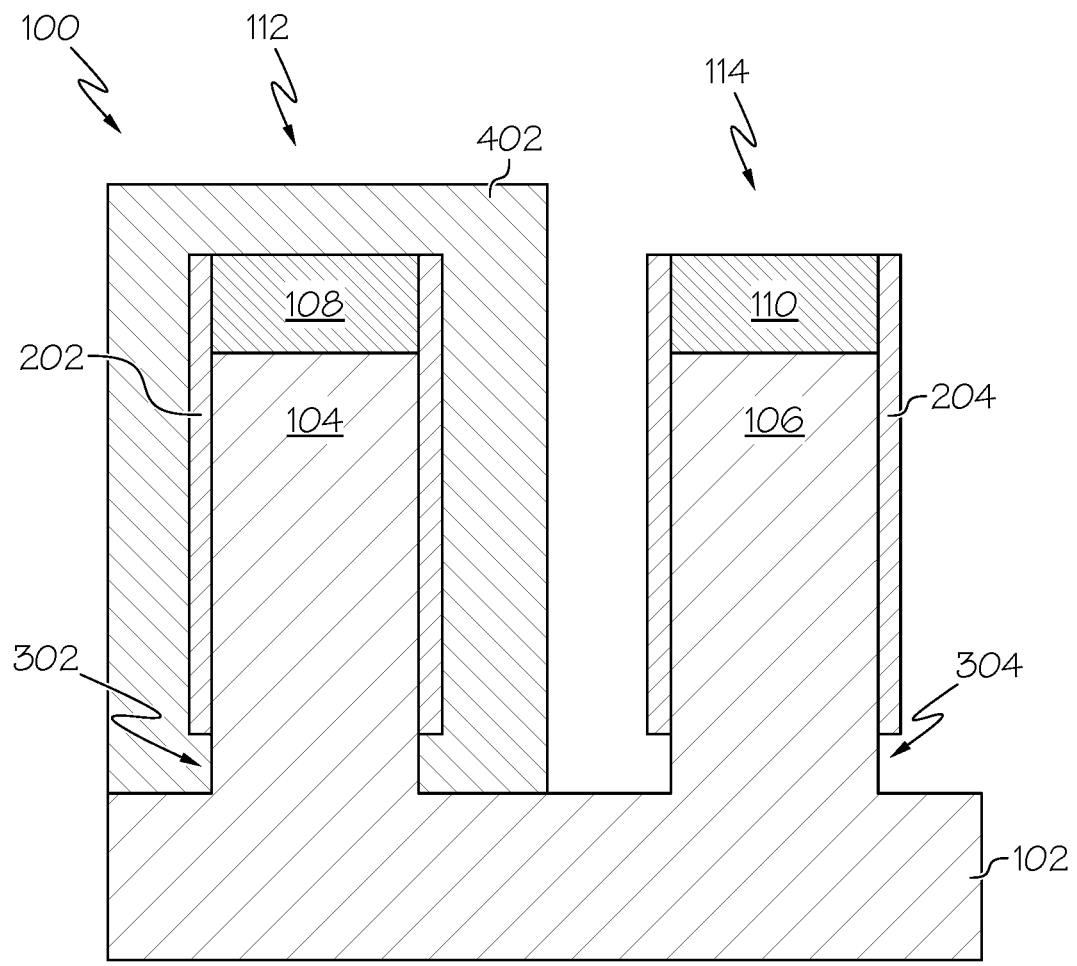
FIG. 4 is a cross-sectional view of the semiconductor structure after the n-type vertical FET device area has been masked off according one embodiment of the present invention.
Figure 5:
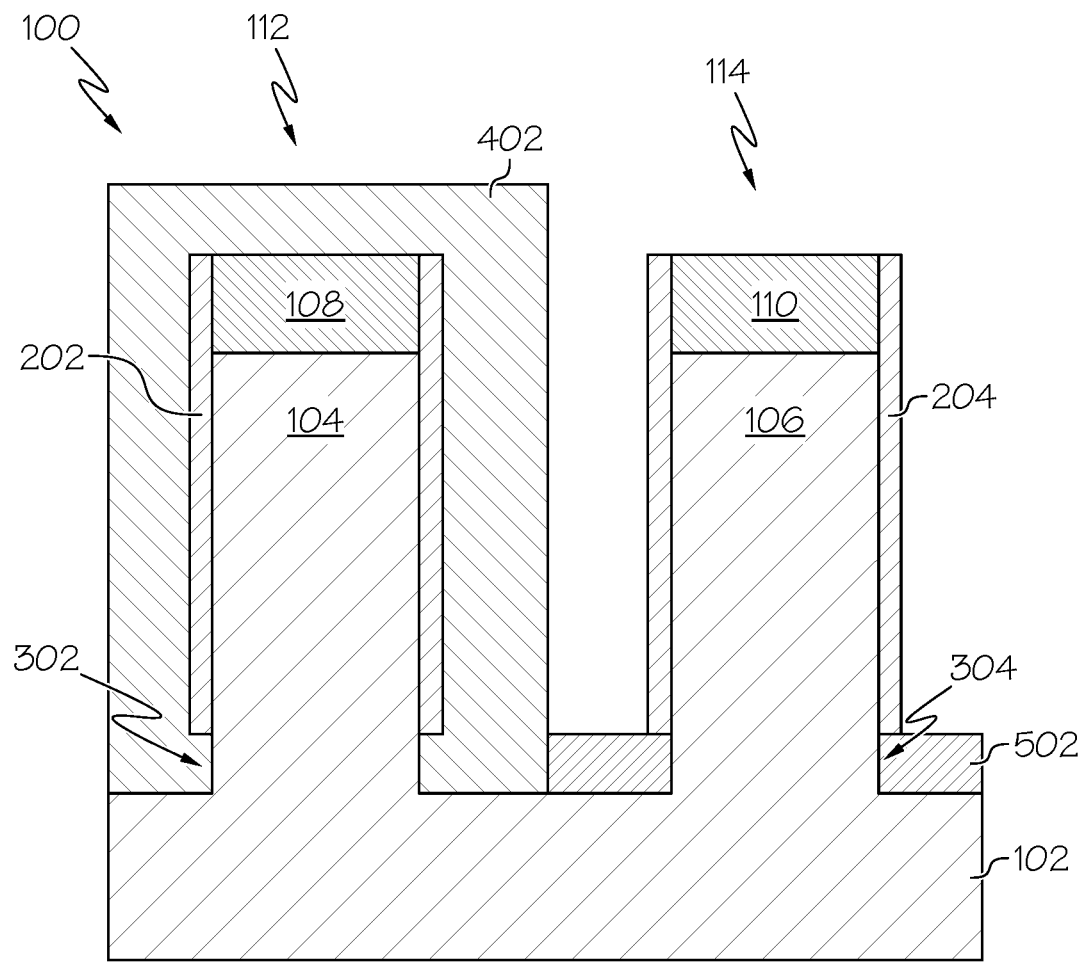
FIG. 5 is a cross-sectional view of the semiconductor structure after a bottom source/drain layer has been formed in the p-type vertical FET device area according one embodiment of the present invention.

FIG. 3 shows that the substrate 102 is then recessed using, for example, a directional RIE process. This process extends the fins 104, 106 and exposes a portion 302, 304 of the fins 104, 106 below the sidewall liners 202, 204. After the recess process has been performed, the nFET device 112 is masked off, as shown in FIG. 4. For example, a masking material having etch selectivity such as amorphous carbon or titanium oxide may be deposited over the entire structure. A patterning stack may then be formed over the masking material blocking off the nFET device area. One or more etching process may then be performed to remove the masking material from the pFET device 114. This process results in a masking layer 402 remaining over the nFET device 112 and further results in the pFET device 114 being disposed.

After the nFET device 112 has been masked off a pFET bottom source/drain layer 502 is formed in contact with the top surface of the substrate in the pFET device area; the exposed portion 304 of the pFET fins 106 below the sidewall liner 204; and the bottom surface of the sidewall liner 204. The bottom source/drain layer 502 may either be a source layer or a drain layer. Examples of materials for the pFET bottom source/drain layer 502 include (but are not limited to) boron doped silicon germanium epitaxy for the pFET device 114. In one non-limiting example, a dopant concentration range may be $1\times10^{18}$/cm$^3$ to $1\times10^{21}$/cm$^3$. In one embodiment, the bottom source/drain layer 502 may have a thickness of about 10 nm to about 100 nm. However, other thicknesses are applicable as well. The pFET bottom source/drain layer 502 may be doped with p-type dopant atoms (i.e., an element from Group III of the Periodic Table of Elements). Examples of p-type dopants for a group IV semiconductor include boron, aluminum, and gallium. Examples of p-type dopants for a III-V semiconductor include beryllium, zinc, cadmium, silicon, and germanium.

In some embodiments, the pFET bottom source/drain layer 502 is formed by epitaxial growth of a semiconductor material, where the epitaxial growth may be a bottom-up growth process. The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

Figure 6:
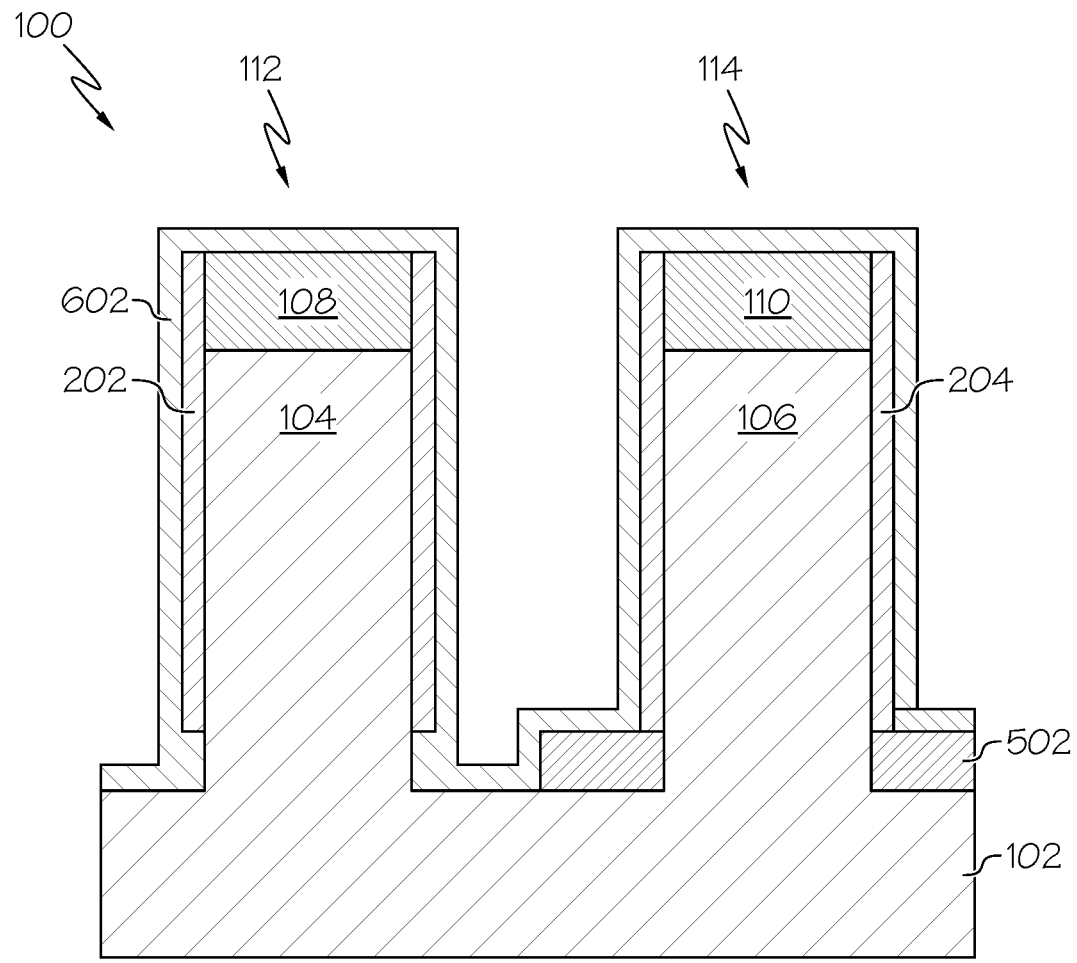
FIG. 6 is a cross-sectional view of the semiconductor structure after a germanium dioxide layer has been formed over the structure according one embodiment of the present invention.

After the pFET bottom source/drain layer 502 has been formed, the masking layer 402 is removed from the nFET device 112, as shown in FIG. 6. The masking layer 402 may be removed using, for example, one or more etching processes such as RIE. A germanium dioxide layer (GeO$_2$) 602 is formed over the entire structure. In one embodiment, the GeO$_2$ layer 602 is conformally deposited using ALD and contacts the top surface of the substrate in the nFET device area; the exposed portion 302 of the nFET fins 104 below the sidewall liner 202; the nFET sidewall liner 202; the top surface of the nFET hardmask 108; the sidewalls of the pFET bottom source/drain layer 502; the top surface of the pFET bottom source/drain layer 502; the pFET sidewall liner 204; and the top surface of the pFET hardmask 110.

Figure 7:
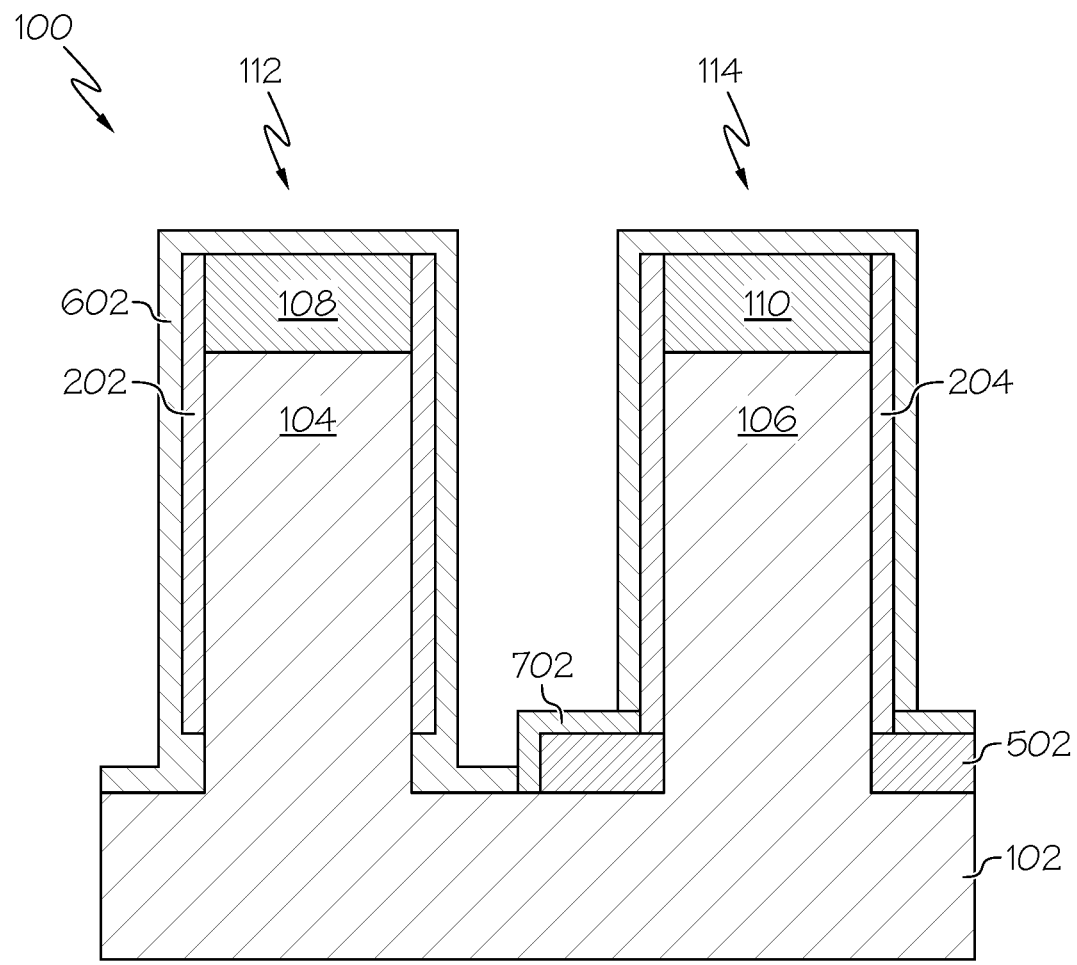
FIG. 7 is a cross-sectional view of the semiconductor structure after a portion of the germanium dioxide layer has been converted into a silicon dioxide layer in contact with the p-type FET device area bottom source/drain layer according one embodiment of the present invention.

A thermal anneal is then performed to form a $SiO_2$ layer 702 in contact with the sidewalls and top surface of the pFET bottom source/drain 502, as shown in FIG. 7. For example, a thermal anneal may be performed for 1 second to 30 seconds at a temperature ranging from 500° C. to 800° C., although other durations and temperatures are applicable as well. The anneal may be performed in a N2 ambient and results in the following reaction between the pFET bottom source/drain layer 502 and the $GeO_2$ layer 602: $Si+Ge 2GeO_2 \rightarrow Ge+2GeO+SiO_2$. In other words, the portion of the $GeO_2$ layer 602 in contact with the pFET bottom source/drain layer 502 is transformed into a $SiO_2$ layer 702 in contact with the top surface and sidewalls of the pFET bottom source/drain layer 502. The Si in the SiGe channel is selectively oxidized due to the lower Gibbs free energy. The $SiO_2$ layer 702 isolates the pFET bottom source/drain layer 502 from a subsequently formed nFET bottom source/drain layer.

Figure 8:
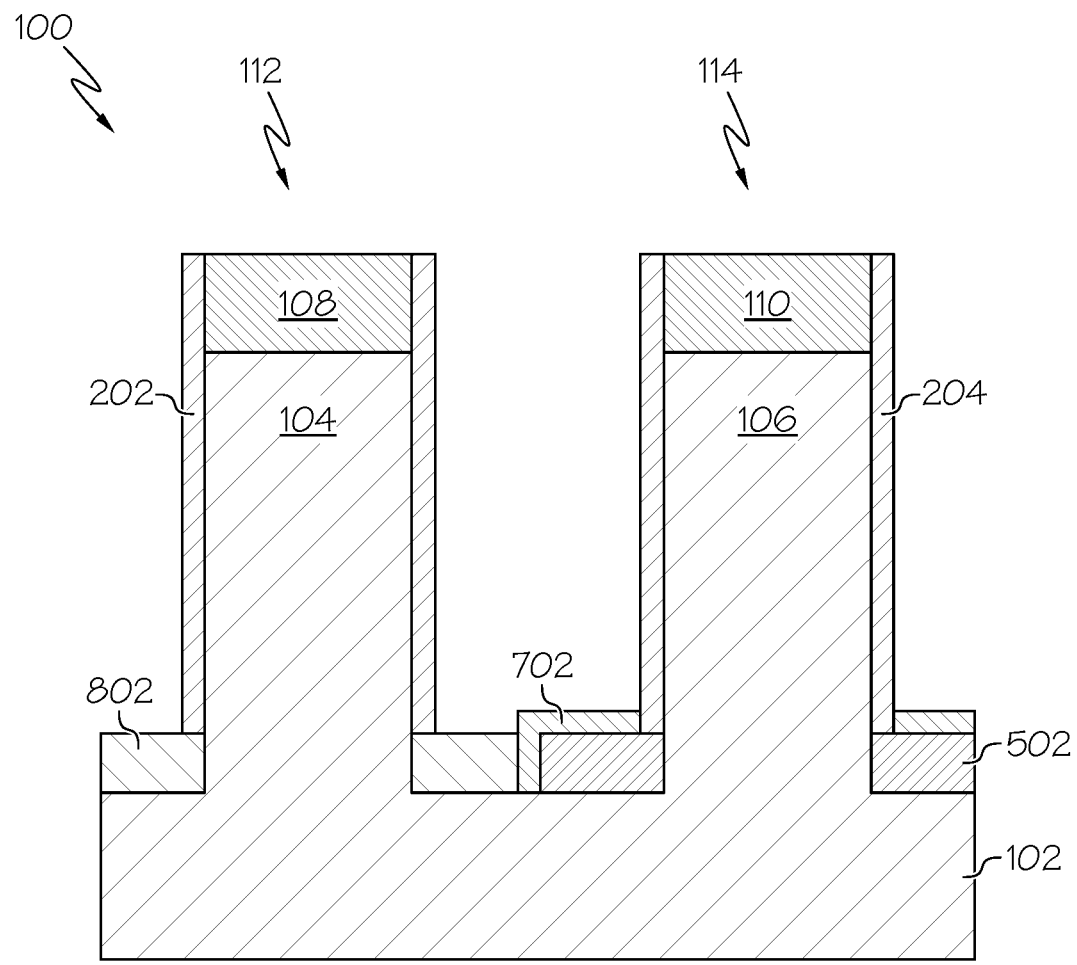
FIG. 8 is a cross-sectional view of the semiconductor structure after unreacted portions of the germanium dioxide layer have been removed according one embodiment of the present invention and after a bottom source/drain layer has been formed in the n-type FET device area according one embodiment of the present invention.

After the $SiO_2$ layer 702 has been formed, the unreacted portions of the $GeO_2$ layer 602 are removed from the device as shown in FIG. 8. In one embodiment, the unreacted portions of the $GeO_2$ layer 602 may be etched/washed away using deionized water. A nFET bottom source/drain layer 802 may then formed in the nFET device area 112. The $SiO_2$ layer 702 allows the nFET bottom source/drain layer 802 to be formed without masking off the pFET device 114. The nFET bottom source/drain layer 802 may be formed in contact with the top surface of the substrate in the nFET device area; the exposed portion 302 of the nFET fins 104 below the sidewall liner 202; and the bottom surface of the sidewall liner 202. The nFET bottom source/drain layer 802 may either be a source layer or a drain layer. Examples of materials for the nFET bottom source/drain layer 802 include (but are not limited to) phosphorus doped silicon epitaxy for the nFET device 112. In one non-limiting example, a dopant concentration range may be $1 \times 10^{18}/cm^3$ to $1 \times 10^{21}/cm^3$.

In one embodiment, the nFET bottom source/drain layer 802 may have a thickness of about 10 nm to about 100 nm. However, other thicknesses are applicable as well. The nFET bottom source/drain layer 802 may be doped with n-type dopant atoms (i.e., an element from Group V of the Periodic Table of Elements). Examples of n-type dopants for a group IV semiconductor include phosphorus, arsenic and antimony. Examples of n-type dopants for a III-V semiconductor include selenium, tellurium, silicon, and germanium. The nFET bottom source/drain layer 802 may be formed using an epitaxy process similar to that discussed above with respect to the pFET bottom source/drain layer 502.

Figure 9:
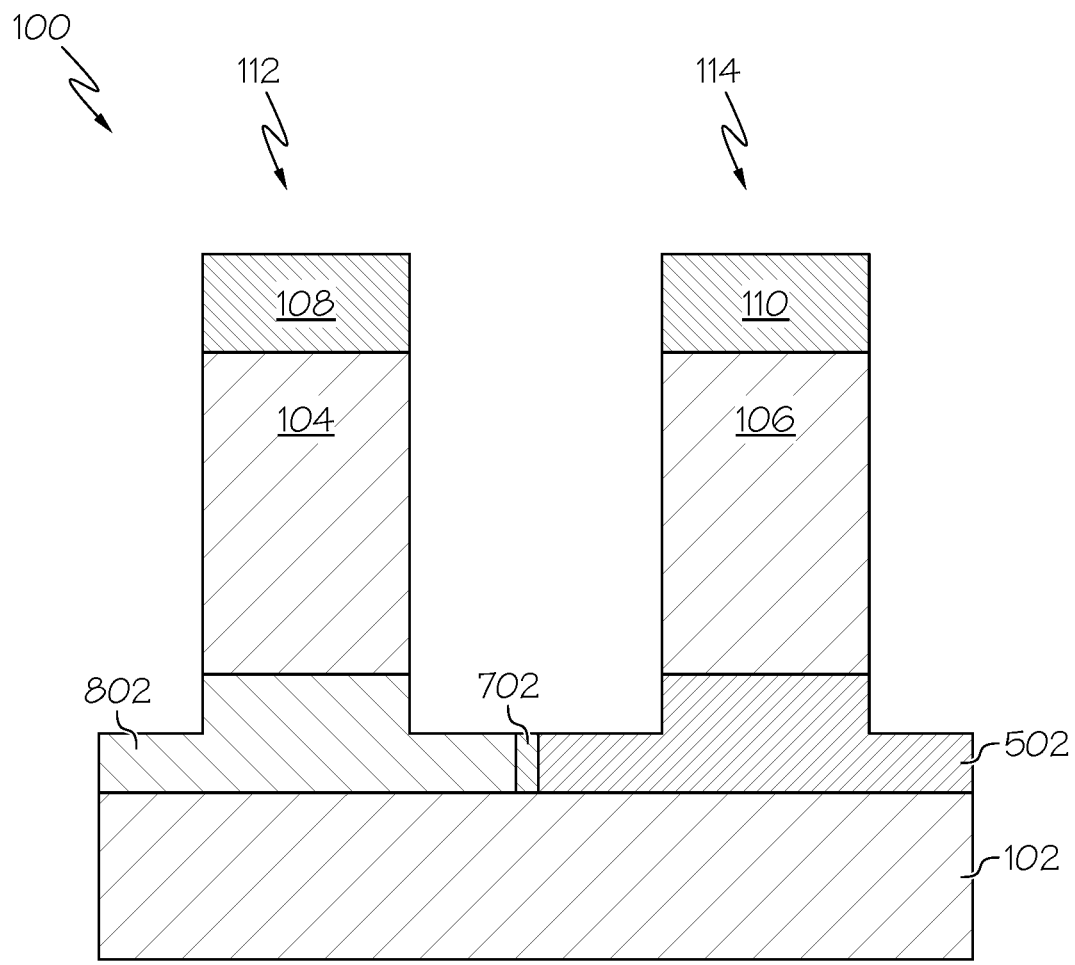
FIG. 9 is a cross-sectional view of the semiconductor structure after the fin liner and silicon dioxide layer have been removed and a dopant drive-in anneal has been performed according one embodiment of the present invention.

FIG. 9 shows that after the nFET bottom source/drain layer 802 has been formed the fin sidewall liners 202, 204 are removed from the nFET and pFET fins 104, 106. The fin sidewall liners 202, 204 may be removed using, for example, a mixture of dilute hydrofluoric acid (DHF) and hydrochloric acid (HCl) wet cleaning process or any other applicable process. In addition, horizontal portions of the $SiO_2$ layer 702 may also be removed using, for example, a dilute hydrofluoric acid. This process leaves the vertical portion of the $SiO_2$ layer 702 situated between the nFET bottom source/drain layer 802 and the pFET bottom source/drain layer 502. A junction anneal such as rapid thermal annealing (RTA) or laser spike annealing (LSA) may then be performed for the nFET bottom source/drain layer 802 and the pFET bottom source/drain layer 502 to activate the source/drain dopants into the fin 104, 106.

Figure 10:
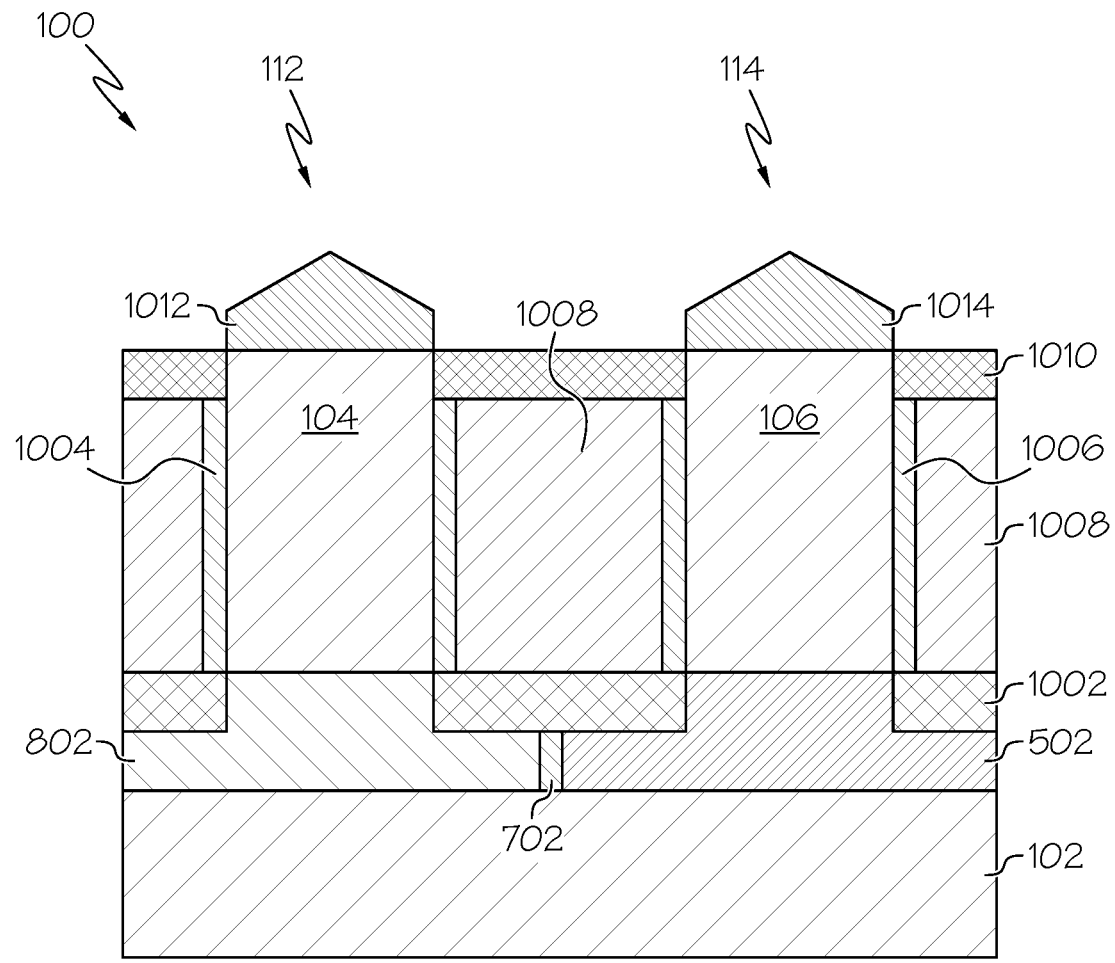
FIG. 10 is a cross-sectional view of one example of a final semiconductor structure comprising a bottom spacer layer in contact with separated nFET and pFET bottom source/drain layers, and further comprising a high-k/metal gate, top spacer layer, and top nFET and pFET source/drain epi according one embodiment of the present invention.

Conventional process may then be performed to complete the vertical FETs, as shown in FIG. 10. In the example shown in FIG. 10, a bottom spacer layer 1002 is formed within each of the nFET and pFET device areas 112, 114. The bottom spacer 1002 may be formed in contact with the top surface of bottom source/drain layers 502, 802, the top surface of the SiO2 layer 702, and sidewalls of the fins 104, 106. In one embodiment, the bottom spacer 1002 comprises an insulating material (such as silicon oxide, silicon nitride, silicon oxynitride, or a combination of these) and may be formed using any conventional deposition and etching processes such as, for example, high density plasma (HDP) deposition or physical vapor deposition (PVD) and subsequent etching techniques. In one embodiment, the spacer 1002 has a thickness of, for example, 3 nm to 30 nm.

High-k dielectric layers 1004, 1006 are formed on and in contact with the sidewalls of each fin 104, 106 and the top surface of the bottom spacer 1002. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layers 1004, 1006 may further include dopants such as lanthanum or aluminum.

In one embodiment, the high-k layers 1004, 1006 are part of a layer comprising a work function metal layer (not shown). In one embodiment, the work function metal layers are formed after and conformal to the high-k layers 1004, 1006 employing CVD, sputtering, or plating. The work function metal layers comprise one or more metals having a function suitable to tune the work function of NFETs or PFETs. Exemplary first metals that can be employed in the work function metal layer include, but are not limited to La, Ti and Ta. The thickness of the work function metal layers can be from 3 nm to 15 nm, although lesser and greater thicknesses can also be employed.

FIG. 10 further shows that a metal gate 1008 is formed around the fins 104, 106. For example, a metal gate material can be deposited by atomic layer deposition (ALD) or physical vapor deposition (PVD). In one embodiment, the metal gate 1008 is a continuous metal gate that wraps around both fins 104, 106. The metal gate 1008 contacts the outer sidewalls of the high-k gate dielectric layers 1004, 1006 and the top surface of a portion of the bottom spacer 1002. A top surface of the metal gate 1008 may be co-planar with the top surface of the high-k dielectric layers 1004, 1006. In one embodiment, the metal gate 1008 comprises, for example, tungsten.

A top spacer 1010 is formed on and in contact with the top surface of the metal gate 1008; the top surface of the high-k dielectric layers 1004, 1006; and portions of the sidewalls of the fins 104. 106 that are above the metal gate 1008 and the high-k dielectric layers 1004, 1006. The top surface of the spacer 1010 may be co-planar with the top surfaces of the fins 104, 106. In one embodiment, the top spacer 1010 may comprise the same or different material as the bottom spacer 1002. For example, the top spacer 1010 may comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structures.

An nFET top source/drain layer 1012 and a pFET top source/drain layer 1014 are formed on and in contact with the top surface of the top spacer 1010, and are further formed in contact with the fins 104, 106 of the nFET and pFET devices 112, 114, respectively. The top source/drain layers 1012, 1014 may be formed by epitaxial growth. In one embodiment, the top source/drain layers 1012, 1014 have a "diamond-shaped/cross-section", It should be rioted that, in other embodiments, the top source/drain layers 1012, 1014 do not include a diamond-shaped/cross-section and has a planar configuration.

Figure 11:
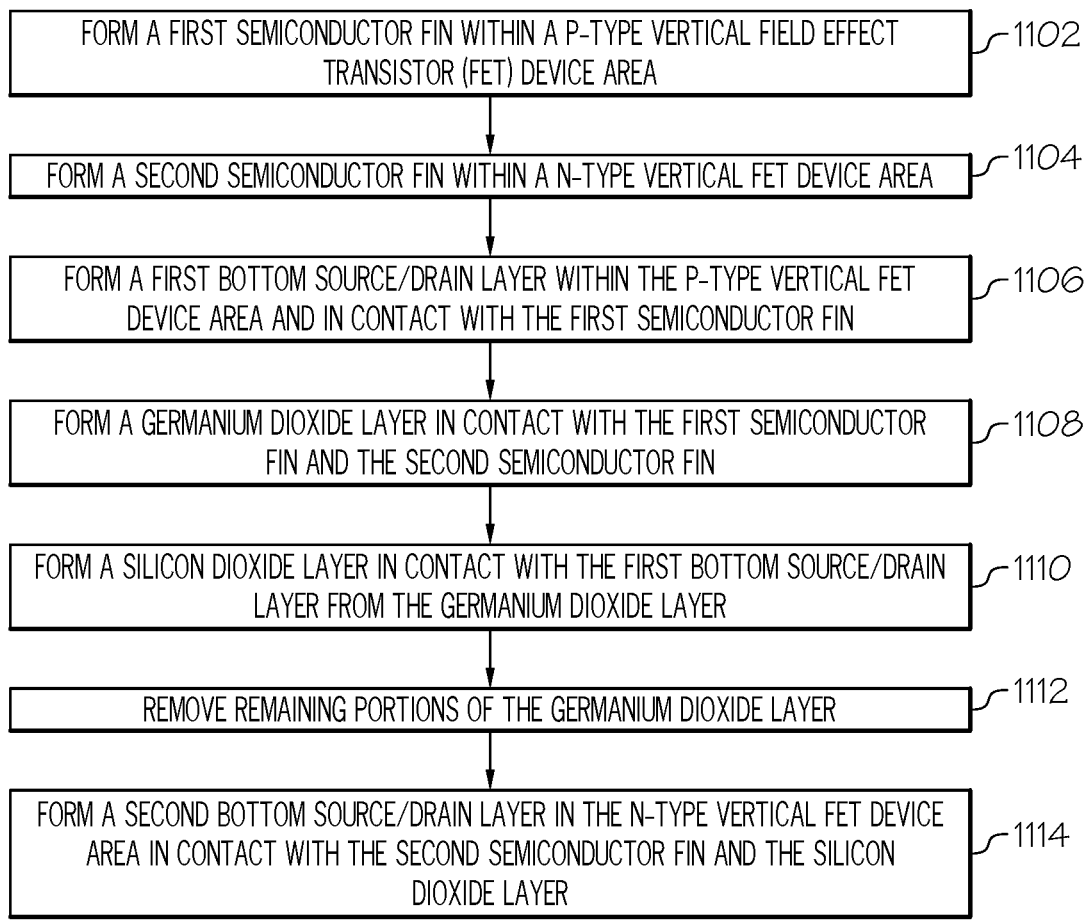
FIG. 11 is an operational flow diagram illustrating one example of a process for forming a semiconductor device comprising n-type and p-type vertical FETs having self-aligned bottom source/drain epitaxial layers according one embodiment of the present disclosure.

FIG. 11 is an operational flow diagram illustrating one example of a process for forming a semiconductor device comprising n-type and p-type vertical FETs having self-aligned bottom source/drain epitaxial layers. It should be noted that each of the steps shown in FIG. 11 has been discussed in greater detail above with respect to FIGS. 1-10. A first semiconductor fin, at step 1102, is formed within a p-type vertical field effect transistor (FET) device area. A second semiconductor fin, at step 1104, is formed within a n-type vertical FET device area. A first bottom source/drain layer, at step 1106, is formed within the p-type vertical FET device area and in contact with the first semiconductor fin. A germanium dioxide layer, at step 1108, is formed in contact with the first semiconductor fin and the second semiconductor fin. A silicon dioxide layer, at step 1110, is formed in contact with the first bottom source/drain layer from the germanium dioxide layer. Remaining portions of the germanium dioxide layer, at step 1112, are removed. A second bottom source/drain layer, at step 1114, is formed in the n-type vertical FET device area in contact with the second semiconductor fin and the silicon dioxide layer.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for forming a semiconductor device, the method comprising at least:
   forming a first bottom source/drain layer in contact with at least a first semiconductor fin within a p-type vertical field effect transistor (FET) device area;
   forming a germanium dioxide layer in contact with the first semiconductor fin and a second semiconductor fin within a n-type vertical FET device area;
   forming a silicon dioxide layer in contact with the first bottom source/drain layer from the germanium dioxide layer;
   removing remaining portions of the germanium dioxide layer; and
   forming a second bottom source/drain layer in the n-type vertical FET device area in contact with the second semiconductor fin and the silicon dioxide layer.

2. The method of claim 1, wherein forming the silicon dioxide layer comprises:
   performing a thermal anneal, wherein the thermal anneal selectively converts a portion of the germanium dioxide layer in contact with the first bottom source/drain layer into the silicon dioxide layer.

3. The method of claim 1, further comprising:
   forming a mask layer over the n-type vertical FET device area prior to forming the first bottom source/drain layer, wherein the first bottom source/drain layer is formed while the mask layer is formed over the n-type vertical FET device area.

4. The method of claim 1, further comprising:
   forming a liner on sidewalls of the first semiconductor fin and the second semiconductor fin; and
   recessing a portion of a substrate in the n-type vertical FET device area and the p-type vertical FET device area below the liner prior to forming the first bottom source/drain layer, wherein the recessing exposes a portion of the first semiconductor fin and the second semiconductor fin.

5. The method of claim 4, wherein forming the first bottom source/drain layer comprises:
   forming the first bottom source/drain layer in contact with a top surface of the substrate in the p-type vertical FET device area, a bottom surface of the liner formed on the first semiconductor fin, and the exposed portion of the first semiconductor fin.

6. The method of claim 4, further comprising:
   removing the liner from the first semiconductor fin and the second semiconductor fin after the second bottom source/drain layer has been formed.

7. The method of claim 1, further comprising:
   removing portions of the silicon dioxide layer from horizontal surfaces of the first bottom source/drain layer.

* * * * *